(12) United States Patent  (10) Patent No.: US 8,082,119 B2
Hwang et al.  (45) Date of Patent: Dec. 20, 2011

(54) METHOD AND SYSTEM FOR MASK FABRICATION PROCESS CONTROL

(75) Inventors: Yuh-Fong Hwang, Hsinchu (TW); Chen-Yu Chang, Taichung (TW); Chiech-Yi Kuo, Hsinchu (TW); Wen-Yao Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 260 days.

(21) Appl. No.: 11/779,426

(22) Filed: Jul. 18, 2007

(65) Prior Publication Data

US 2008/0015818 A1 Jan. 17, 2008

Related U.S. Application Data

(62) Division of application No. 10/792,246, filed on Mar. 3, 2004, now Pat. No. 7,260,442.

(51) Int. Cl.
*G06F 17/50* (2006.01)
*G06F 17/40* (2006.01)
*G06F 19/00* (2011.01)
*G05B 17/00* (2006.01)
*H01L 21/66* (2006.01)
*H01L 21/00* (2006.01)

(52) U.S. Cl. .............. 702/84; 438/15; 700/51; 700/109; 700/121; 702/187; 702/189; 716/54

(58) Field of Classification Search .................. 700/51, 700/1, 9, 28, 29, 30, 31, 44, 47, 90, 95, 96, 700/97, 108, 109, 110, 117, 121; 438/4, 438/14; 702/1, 33, 35, 81, 82, 83, 84, 85, 702/105, 127, 179, 182, 187, 188, 189; 703/2, 703/13, 14, 15, 16, 17, 21; 716/1, 4, 8, 19, 716/20, 21, 50, 54
See application file for complete search history.

(56) References Cited

U.S. PATENT DOCUMENTS

| | | | | |
|---|---|---|---|---|
| 2,883,255 A | * | 4/1959 | Anderson | 346/34 |
| 3,147,370 A | * | 9/1964 | Lowman | 702/81 |
| 3,471,685 A | * | 10/1969 | Bishop | 702/179 |
| 3,522,588 A | * | 8/1970 | Clarke, Jr. et al. | 340/825.56 |
| 3,534,400 A | * | 10/1970 | Dahlin | 700/38 |
| 3,543,010 A | * | 11/1970 | Dahlin | 700/37 |
| 3,598,604 A | * | 8/1971 | De Puy | 430/30 |
| 4,148,065 A | * | 4/1979 | Nakagawa et al. | 430/5 |
| 4,965,742 A | * | 10/1990 | Skeirik | 700/86 |
| 5,774,222 A | * | 6/1998 | Maeda et al. | 356/394 |
| 5,965,306 A | * | 10/1999 | Mansfield et al. | 430/22 |

(Continued)

OTHER PUBLICATIONS

IBM-TDB: "Exposure Mask Diagnostic and Disposition Targets", Mar. 1, 1980, vol. 22, No. 10, pp. 4505-4507.*

*Primary Examiner* — Edward Cosimano
(74) *Attorney, Agent, or Firm* — Thomas|Kayden

(57) ABSTRACT

A method for controlling mask fabrication is provided, wherein the method uses statistical process control analysis. A manufacturing model is defined. A process run of a mask is performed as defined by the manufacturing model. A fault detection analysis is performed to reduce a bias in the manufacturing model. A fine-tuning signal is generated in response to a result of the fault detection analysis. The process run operation is adjusted according to the fine-tuning signal.

11 Claims, 7 Drawing Sheets

U.S. PATENT DOCUMENTS

| | | | |
|---|---|---|---|
| 6,016,357 A * | 1/2000 | Neary et al. | 382/144 |
| 6,091,845 A * | 7/2000 | Pierrat et al. | 382/144 |
| 6,114,695 A | 9/2000 | Todokoro et al. | |
| 6,248,602 B1 * | 6/2001 | Bode et al. | 438/14 |
| 6,263,099 B1 * | 7/2001 | Maeda et al. | 382/149 |
| 6,272,236 B1 * | 8/2001 | Pierrat et al. | 382/144 |
| 6,350,977 B2 * | 2/2002 | Taoka | 250/204 |
| 6,404,498 B1 * | 6/2002 | Maeda et al. | 356/394 |
| 6,405,096 B1 * | 6/2002 | Toprac et al. | 700/121 |
| 6,460,002 B1 * | 10/2002 | Bone et al. | 702/81 |
| 6,622,061 B1 * | 9/2003 | Toprac et al. | 700/121 |
| 6,625,800 B1 * | 9/2003 | Qian et al. | 716/51 |
| 6,627,362 B2 * | 9/2003 | Stivers et al. | 430/5 |
| 6,700,122 B2 * | 3/2004 | Matsui et al. | 250/310 |
| 6,708,075 B2 * | 3/2004 | Sonderman et al. | 700/121 |
| 6,871,114 B1 * | 3/2005 | Green et al. | 700/110 |
| 6,883,158 B1 | 4/2005 | Sandstrom et al. | |
| 6,957,120 B1 * | 10/2005 | Bode et al. | 700/121 |
| 7,047,094 B2 * | 5/2006 | Koyama | 700/97 |
| 7,061,600 B2 * | 6/2006 | Maeda et al. | 356/237.2 |
| 7,089,075 B2 * | 8/2006 | Hasan | 700/121 |
| 7,117,062 B1 * | 10/2006 | Sonderman et al. | 700/121 |
| 7,180,584 B2 * | 2/2007 | Maeda et al. | 356/237.2 |
| 7,181,354 B1 * | 2/2007 | Bone et al. | 702/84 |
| 7,254,458 B2 * | 8/2007 | Hasan | 700/121 |
| 7,260,442 B2 * | 8/2007 | Hwang et al. | 700/121 |
| 7,367,008 B2 * | 4/2008 | White et al. | 716/19 |
| 7,492,940 B2 * | 2/2009 | Bruce et al. | 382/144 |
| 7,492,941 B2 * | 2/2009 | Bruce et al. | 382/144 |
| 7,646,906 B2 * | 1/2010 | Saidin et al. | 382/144 |
| 2001/0048478 A1 * | 12/2001 | Taoka | 348/308 |
| 2002/0134936 A1 * | 9/2002 | Matsui et al. | 250/310 |
| 2002/0154303 A1 * | 10/2002 | Maeda et al. | 356/394 |
| 2002/0165636 A1 * | 11/2002 | Hasan | 700/121 |
| 2003/0082460 A1 * | 5/2003 | Stivers et al. | 430/5 |
| 2003/0097198 A1 * | 5/2003 | Sonderman et al. | 700/110 |
| 2003/0161525 A1 * | 8/2003 | Bruce et al. | 382/149 |
| 2003/0188289 A1 * | 10/2003 | Koyama | 716/19 |
| 2003/0229881 A1 * | 12/2003 | White et al. | 716/19 |
| 2004/0075837 A1 * | 4/2004 | Maeda et al. | 356/394 |
| 2005/0198609 A1 * | 9/2005 | Hwang et al. | 716/21 |
| 2006/0236294 A1 * | 10/2006 | Saidin et al. | 716/19 |
| 2006/0247818 A1 * | 11/2006 | Hasan | 700/121 |
| 2007/0070336 A1 * | 3/2007 | Maeda et al. | 356/237.2 |
| 2007/0237384 A1 * | 10/2007 | Bruce et al. | 382/144 |
| 2007/0248257 A1 * | 10/2007 | Bruce et al. | 382/144 |

* cited by examiner

METHOD AND SYSTEM FOR MASK FABRICATION PROCESS CONTROL

CROSS-REFERENCE TO RELATED APPLICATION

This application is a Divisional of U.S. patent application Ser. No. 10/792,246, filed Mar. 3, 2004 and entitled "METHOD AND SYSTEM FOR MASK FABRICATION PROCESS CONTROL", now U.S. Pat. No. 7,260,442, which is incorporated herein by reference.

BACKGROUND

The present invention relates to mask fabrication and particularly to a control system used in mask fabrication for controlling feature critical dimensions (CD).

The critical dimension, or absolute size of a feature, includes linewidth, spacing or contact dimensions. Errors in mask critical dimensions have great impact during image transfer to a wafer. Only a mask with correct critical dimensions can correctly transfer an image onto a wafer. As optical lithography pushes to smaller and smaller dimensions, patterned features smaller than the wavelength of light must be routinely manufactured. In this system mask errors make up an increasingly large share of the sources of critical dimension (CD) errors. Critical dimension control is affected by a variety of factors including fabrication tools and equipment, recipes, and raw materials.

FIG. 1 is a schematic view showing a conventional mask fabrication process. A conventional mask fabrication process includes writing, baking, developing, etching, after-etch inspection (AEI), re-etching, stripping of the photoresist, and after-strip inspection (ASI) steps. Critical dimensions are largely determined by specific characteristics of the aforementioned steps. Accordingly, the process parameters of the writer and etcher are largely determined by device data of the processed mask and material data of the raw materials used in the writing step. The inspection results obtained by the after-etch inspector and after-strip inspector are not utilized to fine-tune the processing conditions in the conventional mask fabrication systematically.

The greatest disadvantage of the conventional mask fabrication process is that it is not effective in controlling CD variations. There is usually a substantial error rate in critical dimensions subsequent to the first etching step such that a re-etch step is needed. The re-etch step is costly and impacts the mask uniformity.

Hence, there is a need for a mask fabrication process that addresses the problems arising from the existing technology.

SUMMARY

It is therefore an object of the invention to provide a mask fabrication system and method capable of statistical process control analysis, which analyzes causes of critical dimension variation during mask fabrication.

Another object of the present invention is to provide a mask fabrication system and method capable of controlling critical dimension variation through adjusting recipe variables during mask fabrication.

Yet another object of the present invention is to provide a fabrication system and method capable of producing masks corresponding to defined critical dimensions without requiring a re-etch process.

To achieve the above objects, the present invention provides a system and method capable of analyzing causes of critical dimension variation and controlling critical dimension variation through adjusting manufacturing models during mask fabrication. By precisely controlling critical dimension, the mask fabrication system and method produces masks with preset critical dimensions without requiring a re-etch process.

According to one embodiment of the invention, a mask fabrication system contains a processing tool, a metrology tool, and a controller. The processing tool processes a mask. The metrology tool inspects the mask to obtain an inspection result. The controller generates a manufacturing model of the processing tool and calibrates the manufacturing model according to device data, material data, and the inspection result of the mask.

According to another embodiment of the invention, a mask fabrication method is provided. First, material and device data are provided. Second, a first manufacturing model is defined according to the material and the device data. Then a first process run of a first mask is performed as defined by the first manufacturing model. At the same time, the first process data is collected during the first process run. Next, a backward modification data is determined according to the material, the device, and the first process data. Then, the first manufacturing model is adjusted according to the backward modification data to obtain a second manufacturing model. Next, a second process run of a second mask is performed as defined by the second manufacturing model.

The above-mentioned method may take the form of program code embodied in a tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The present invention will now be described with reference to FIGS. 2 to 5, which in general relate to a mask fabrication system.

Figure 1:
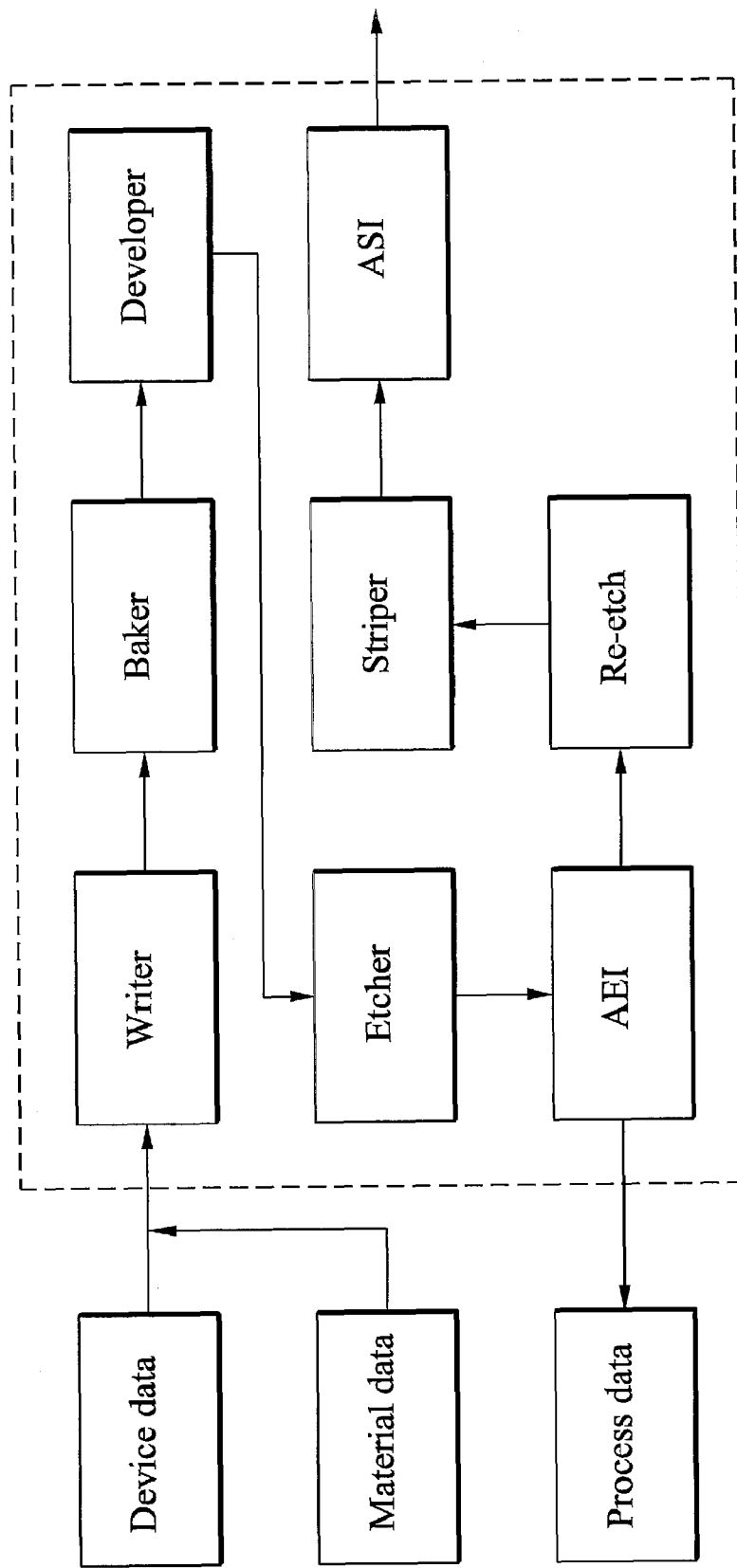
FIG. 1 is a schematic view of a conventional mask fabrication process.
Figure 2:
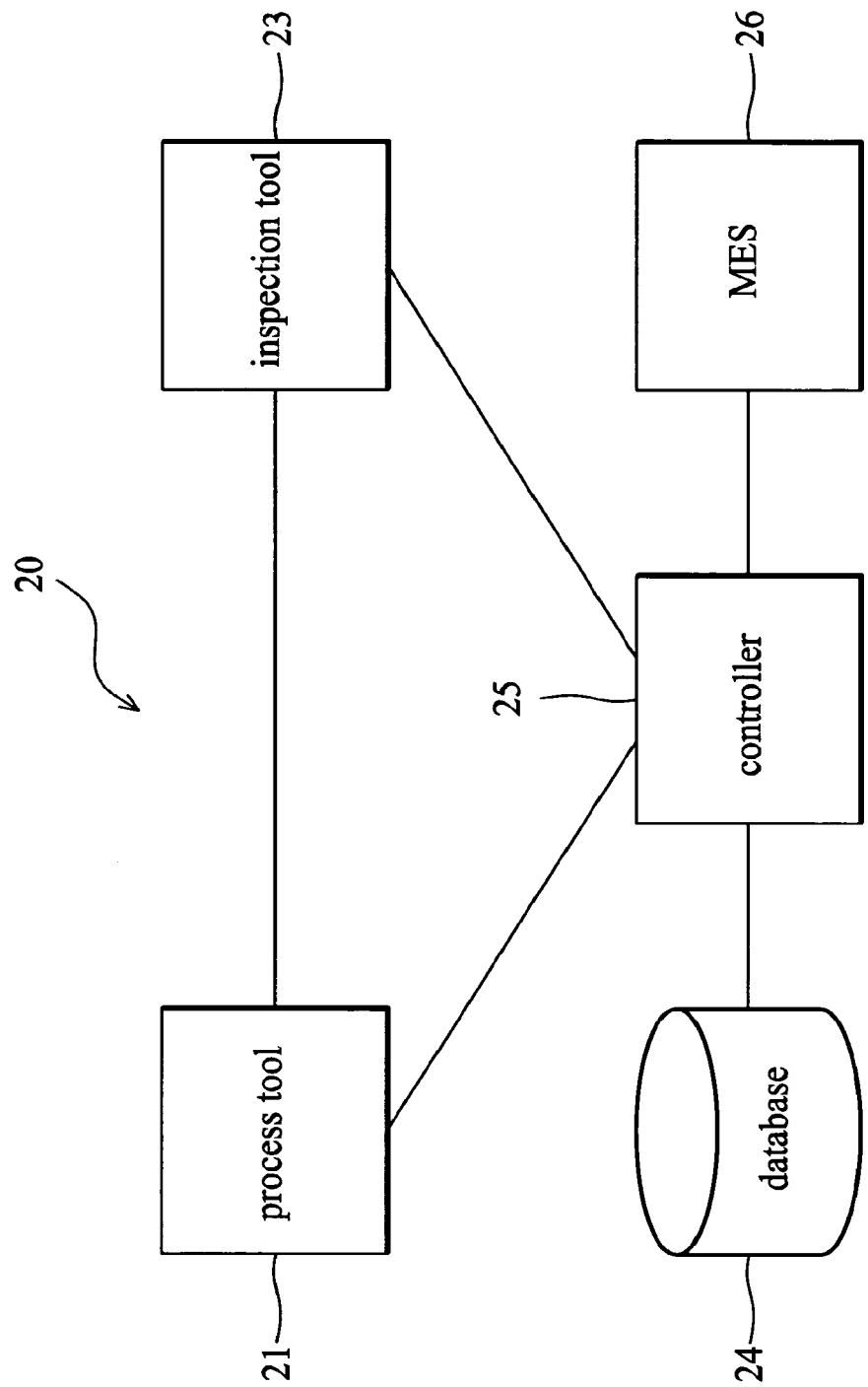
FIG. 2 is a schematic view showing a mask fabrication system according to one embodiment of the present invention.

FIG. 2 is a schematic view showing a mask fabrication system according to an embodiment of the present invention. The mask fabrication system 20 contains at least one processing tool 21, a metrology tool 23, a controller 25, a database 24, and a manufacture executive system (MES) 26.

Processing tool 21 can be an exposure tool, a baker, a developer, an etcher, or a photoresist stripper. Metrology tool 23 executes an after-etch inspection or an after-strip inspection and obtains an after-etch inspection result or an after-strip inspection result respectively. Controller 25 is used for run-to-run control, including feed forward control and feed backward control, of the processing tool 21. Controller 25 receives the after-etch or after-strip inspection result from metrology tool 23 and retrieves device and material data from database 24. Controller 25, connected with MES 26, generates a manufacturing model of the processing tool 21 and calibrates the manufacturing model according to the device data, the material data, and the inspection result of the mask. Controller 25 also monitors operating conditions of the processing tool 21 and adjusts the manufacturing model of the processing tool 21 during the process.

According to this embodiment, the device and material data of the mask are stored in database 24. The device data of the mask includes device type data, mask layer data, mask grade data, optical correction type data, customer data, pattern loading data, and device loading data. The material data of the mask relates to the raw materials consumed in the mask fabrication process, including data of photoresist post coating decay, batch relation and photoresist production date.

As illustrated in FIG. 2, controller 25, connected with MES 26, retrieves data for generating the manufacturing model of the processing tool 21. The manufacturing model includes a parameter set and recipe of the processing tool.

Figure 3A:
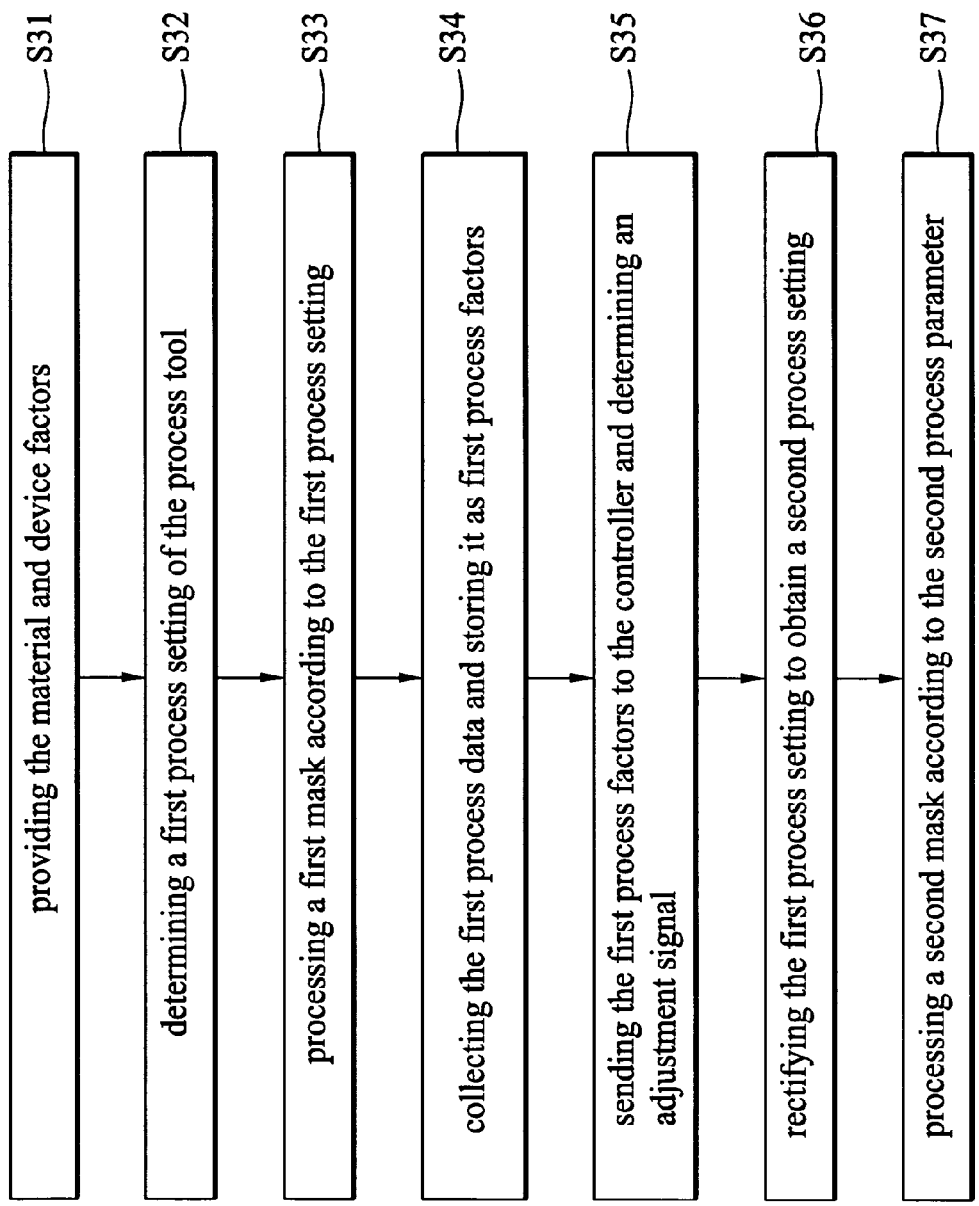
FIGS. 3A and 3B illustrate flowcharts of the mask fabrication method with run-to-run control of the system in FIG. 2.

FIG. 3A is a flowchart of a backward control of the mask fabrication method of the system in FIG. 2. The mask fabrication method as shown in FIG. 3A controls operation of processing tools in the mask fabrication system described above and shown in FIG. 2. The processing tool, controlled by the method shown in FIG. 3A, can be a writer, a baker, a developer, or an etcher.

First, material and device data are provided (step S31). The material data mainly comprises information regarding photoresist and other raw material consumed during the fabrication process. The device data refers to a product for which the mask is designed. According to this embodiment, the material and device data are stored in database 24, which is connected directly to the controller 25 or via a network.

Second, a first manufacturing model of the processing tool 21 is determined (step S32). The controller 25 retrieves the material and the device data from database 24 and determines the first manufacturing model of the processing tool 21 accordingly.

Next, a first process run of a first mask is performed according to the first manufacturing model (step S33). The first mask is processed sequentially by the exposure tool, baker, developer, and etcher. During the first process run, a first process data is collected (step S34). The first process data is sent to the controller, and backward modification data is determined according to the material, the device, and the first process data (step S35). The backward modification data is determined using statistical methods. According to this embodiment, the material, the device, and the first process data are assigned as nominal or continuing variables in accordance with the characteristics thereof. The static material data (such as photoresist type factor) and static device data (such as device type factor) are assigned as corresponding nominal variables respectively. The dynamic material, device and process data are assigned as corresponding continuing variables respectively. The nominal and the continuing variables are processed using ANOVA and regression analysis methods respectively. Next, the first manufacturing model is modified according to the backward modification data to obtain a second manufacturing model (step S36). After the manufacturing model is modified, a second process run of a second mask is performed by the processing tool 23 according to the second manufacturing model (step S37).

Figure 3B:
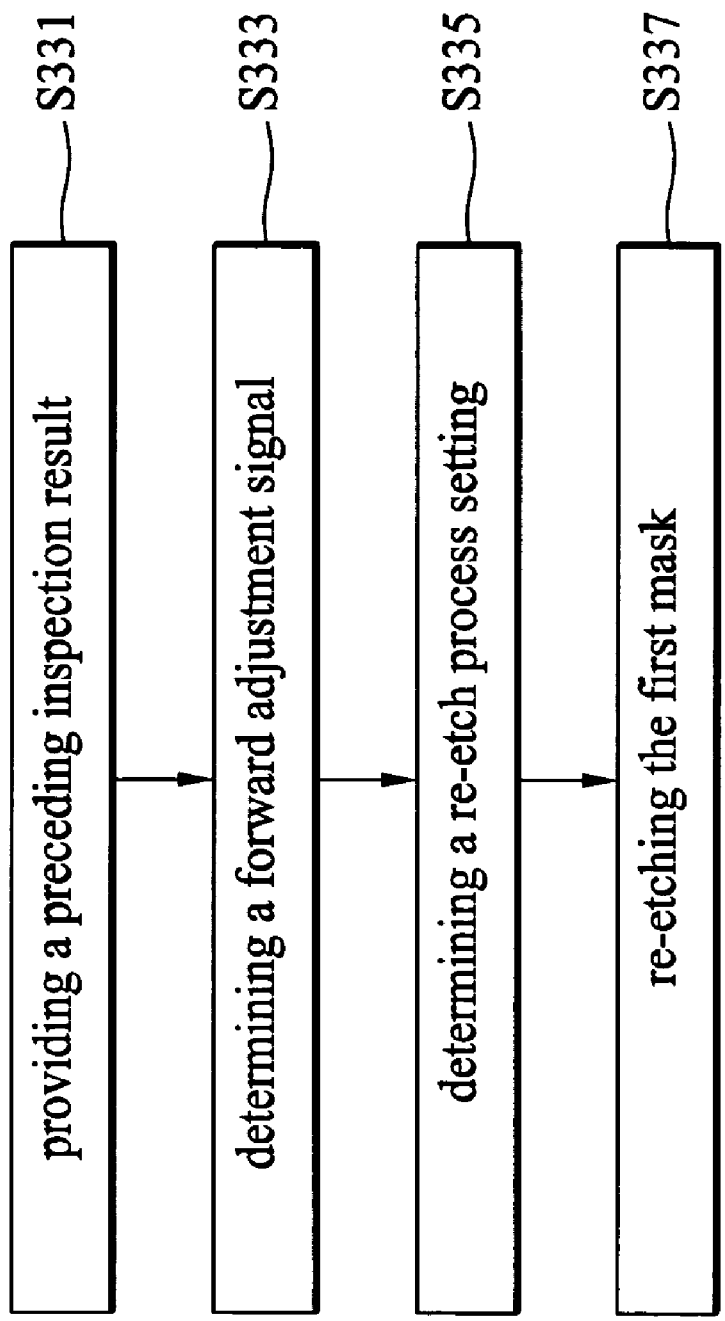

As mentioned above, the first mask is processed in step S33. If the critical dimensions of the first mask do not match a target value, the first mask will undergo a re-etch process to trim the critical dimensions until the target value is met. Referring to FIG. 3B, a flowchart illustrates a feed forward control of the mask fabrication method of the system shown in FIG. 2. First, an inspection result of a preceding process run is received (step S331), wherein the inspection result is an after-strip inspection result. Next, a forward modification data is determined according to the first production data and the inspection result (step S333). Then a re-etch manufacturing model is determined according to the forward modification data (step S335). After the re-etch setting is determined, a re-etch process run of the first mask is performed as defined by the re-etch manufacturing model (step S337). The processing tool controlled by the method shown in FIG. 3B is an etcher or a photoresist stripper.

Figure 4:
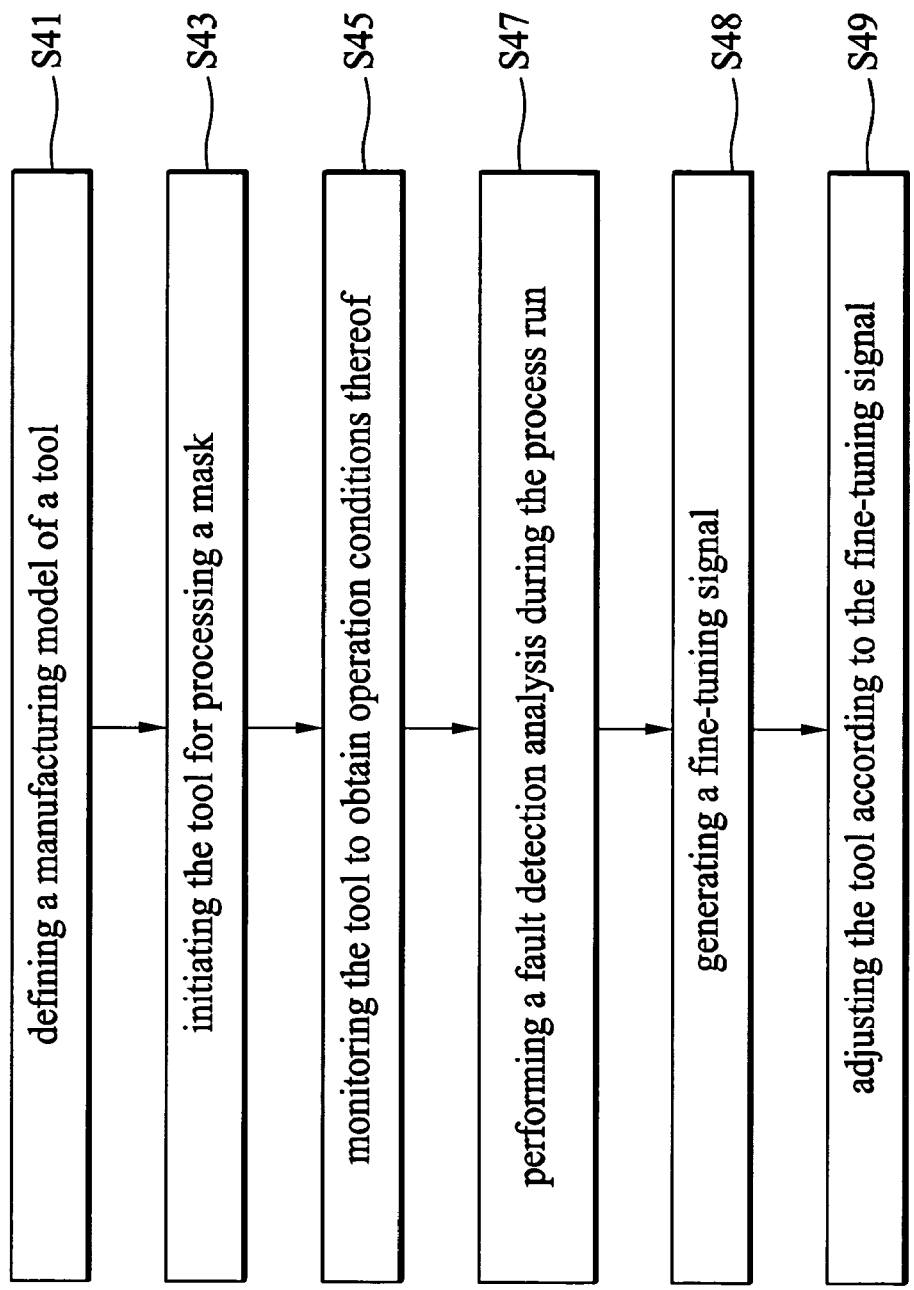
FIG. 4 illustrates a flowchart of the mask fabrication method with real-time control of the system in FIG. 2.

FIG. 4 illustrates a flowchart of the mask fabrication method with real-time control of the system in FIG. 2. First, a manufacturing model is defined (step S41). Then a process run of a mask is performed as defined by the manufacturing model (step S43). Then the tool is monitored to obtain operation conditions thereof (step S45). A fault detection analysis is performed during the process run to reduce bias in the manufacturing model (step S47). Then a fine-tuning signal is generated in response to a result of the fault detection analysis (step S48). Then the processing tool is adjusted according to the fine-tuning signal, and the process run is operated successively by the adjusted processing tool (step S49).

The run-to-run and real-time control methods discussed above can be implemented together or separately.

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 5A:
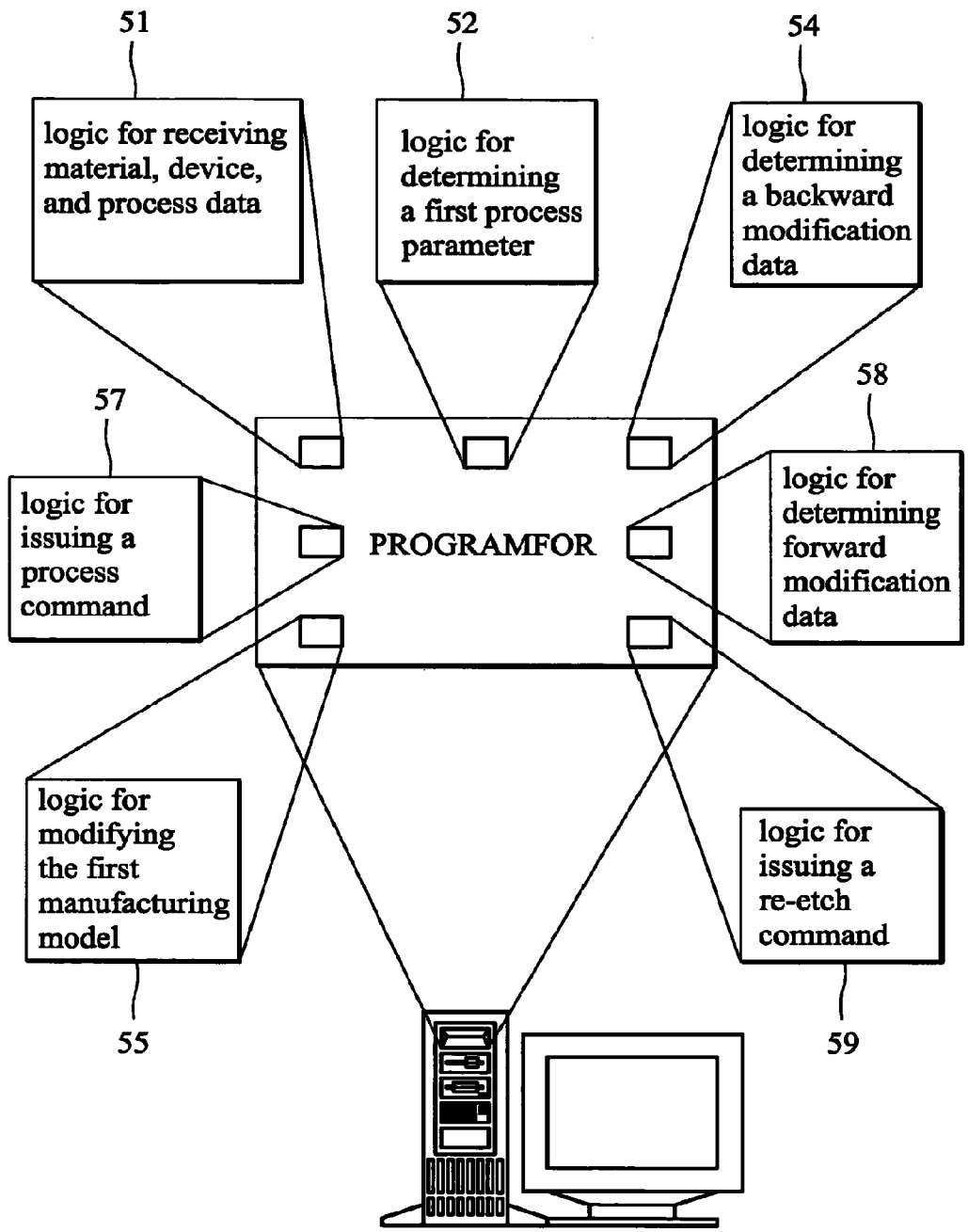
FIGS. 5A and 5B are diagrams of a storage medium for storing a computer program providing a method for mask fabrication control according to one embodiment of the present invention.

FIG. 5A is a diagram of a storage medium for storing a computer program providing the run-to-run process control method according to the present invention. The computer program product comprises a computer usable storage medium having computer readable program code embodied in the medium, the computer readable program code comprising computer readable program code 51 for receiving material, device, first process data of a mask, and an inspection result of a preceding process run, a computer readable program code 52 for determining a first manufacturing model according to the material and the device data, and a computer readable program code 54 for determining backward modification data according to the material, the device, and the first process data, and a computer readable program code 55 for modifying the first manufacturing model according to the backward modification data to obtain a second manufacturing model, a computer readable program code 57 for issuing a process command to perform a second process run of a second mask and a re-etch process run of the first mask as defined by the re-etch manufacturing model, a computer readable program code 58 for determining forward modification data according to the first production data and the inspection result, a computer readable program code 59 for determining a re-etch manufacturing model according to the forward modification data.

Figure 5B:
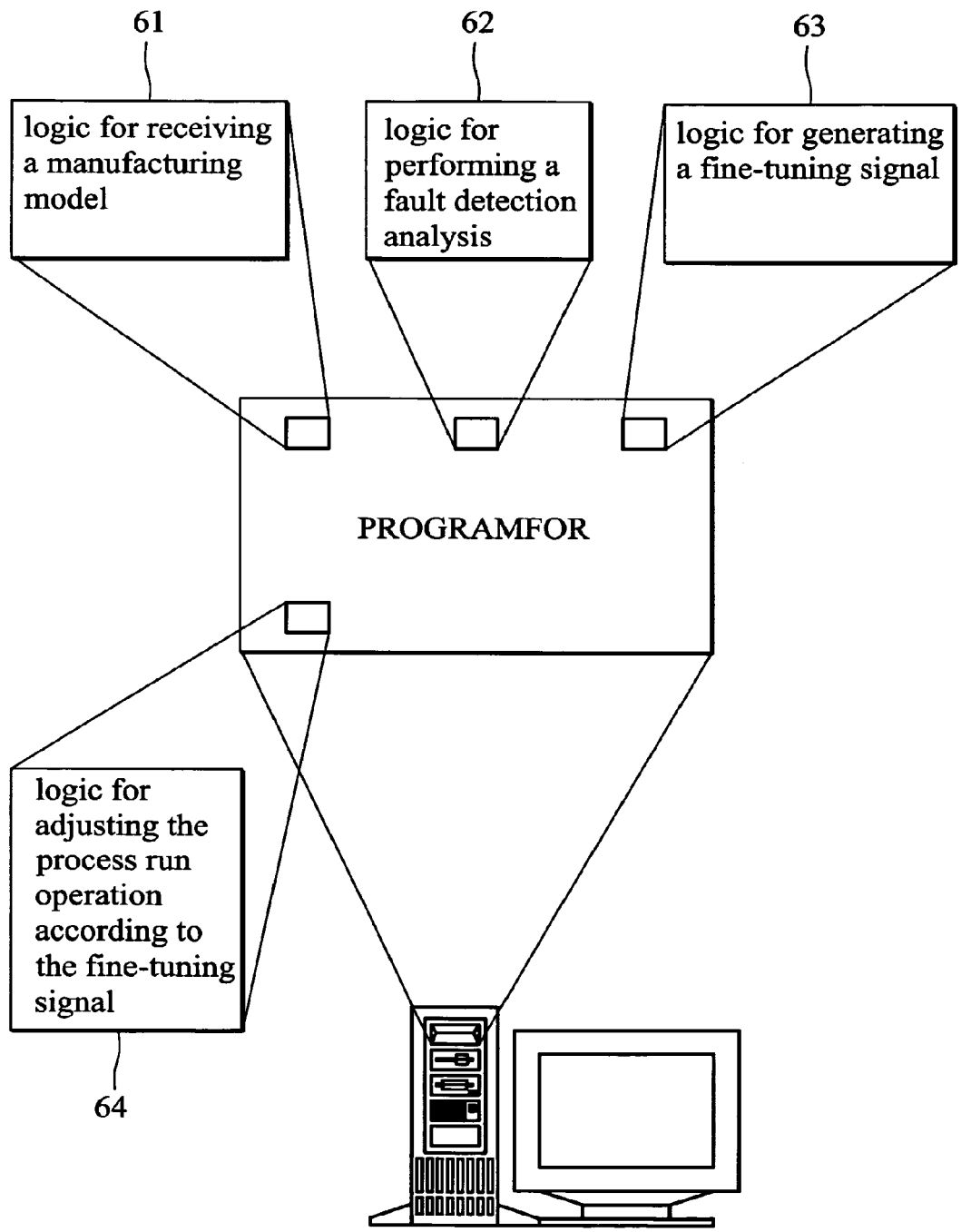

FIG. 5B is a diagram of a storage medium for storing a computer program providing the real-time process control method according to the present invention. The computer program product comprises a computer usable storage medium having computer readable program code embodied in the medium, the computer readable program code comprising computer readable program code 61 for receiving a manufacturing model, a computer readable program code 62 for performing a fault detection analysis to reduce bias in the manufacturing model, and a computer readable program code 63 for generating a fine-tuning signal in response to a result of the fault detection analysis, and a computer readable program code 64 for adjusting the process run operation according to the fine-tuning signal.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method, executed by a computer, for controlling mask fabrication using statistical process control analysis, comprising:
    defining a manufacturing model that describes a fabricating process for masks according to material data and device data;
    performing a process run of a mask as defined by the manufacturing model;
    performing a fault detection analysis to reduce a bias in the manufacturing model by the computer, wherein the fault detection analysis comprises collecting process data during the process run;
    generating a fine-tuning signal in response to a result of the fault detection analysis according to the material data, the device data and the process data using analysis of variance method and regression analysis method by the computer; and
    adjusting the process run operation according to the fine-tuning signal.

2. The method of claim 1, wherein the manufacturing model defining step further comprises defining a manufacturing model that describes a writing process for masks.

3. The method of claim 1, wherein the manufacturing model defining step further comprises defining a manufacturing model that describes a baking process for masks.

4. The method of claim 1, wherein the manufacturing model defining step further comprises defining a manufacturing model that describes a developing process for masks.

5. The method of claim 1, wherein the manufacturing model defining step further comprises defining a manufacturing model that describes an etching process for masks.

6. The method of claim 1, wherein the manufacturing model defining step further comprises defining a manufacturing model that describes an stripping process for masks.

7. A computer readable storage medium for storing a computer program providing a method for controlling mask fabrication using statistical process control analysis, the method comprising:
    receiving a manufacturing model according to material data and device data;
    performing a fault detection analysis to reduce a bias in the manufacturing model by a computer, wherein the fault detection analysis comprises collecting process data during the process run;
    generating a fine-tuning signal in response to a result of the fault detection analysis according to the material data, the device data and the process data using analysis of variance method and regression analysis method by the computer; and
    adjusting the process run operation according to the fine-tuning signal.

8. The storage medium of claim 7, wherein the manufacturing model defining step further comprises defining a manufacturing model that describes a writing process for masks.

9. The storage medium of claim 7, wherein the manufacturing model defining step further comprises defining a manufacturing model that describes a baking process for masks.

10. The storage medium of claim 7, wherein the manufacturing model defining step further comprises defining a manufacturing model that describes a developing process for masks.

11. The storage medium of claim 7, wherein the manufacturing model defining step further comprises defining a manufacturing model that describes an etching process for masks.

* * * * *